United States Patent
Djebbour et al.

(10) Patent No.: US 10,636,928 B2
(45) Date of Patent: Apr. 28, 2020

(54) PHOTOVOLTAIC CELL

(71) Applicants: Centre national de la recherche scientifique, Paris (FR); CENTRALESUPELEC, Gif sur Yvette (FR); Université Versailles Saint-Quentin-en-Yvelines, Versailles (FR)

(72) Inventors: Zakaria Djebbour, Villebon sur Yvette (FR); Anne Migan, Palaiseau (FR); Jean-Paul Kleider, Bures sur Yvette (FR); Walid El-Huni, Magny les Hameaux (FR)

(73) Assignees: Centre national de la recherche scientifique, Paris (FR); CENTRALESUPELEC, Gif sur Yvette (FR); Université Versailles Saint-Quentin-en-Yvelines, Versailles (FR)

( * ) Notice: Subject to any disclaimer, the term of this patent is extended or adjusted under 35 U.S.C. 154(b) by 13 days.

(21) Appl. No.: 15/780,817

(22) PCT Filed: Dec. 2, 2016

(86) PCT No.: PCT/FR2016/053195
§ 371 (c)(1),
(2) Date: Jun. 1, 2018

(87) PCT Pub. No.: WO2017/093695
PCT Pub. Date: Jun. 8, 2017

(65) Prior Publication Data
US 2019/0273173 A1    Sep. 5, 2019

(30) Foreign Application Priority Data
Dec. 4, 2015  (FR) ..................... 15 61893

(51) Int. Cl.
*H01L 31/078* (2012.01)
*H01L 31/042* (2014.01)
(Continued)

(52) U.S. Cl.
CPC .......... *H01L 31/078* (2013.01); *H01L 31/042* (2013.01); *H01L 31/0687* (2013.01);
(Continued)

(58) Field of Classification Search
CPC . H01L 31/078; H01L 31/042; H01L 31/0687; H01L 31/0725; H01L 31/0693; H01L 51/00; H01L 51/42
See application file for complete search history.

(56) References Cited

U.S. PATENT DOCUMENTS 4,295,002 A * 10/1981 Chappell ......... H01L 31/035281
                                                           136/244
4,451,691 A *  5/1984 Fraas ................... H01L 27/142
                                                           136/249
(Continued)

FOREIGN PATENT DOCUMENTS

WO     2015151422 A1    10/2015

OTHER PUBLICATIONS

International Search Report and Written Opinion for PCT/FR2016/053195 dated Mar. 3, 2017.

*Primary Examiner* — Jayne L Mershon
(74) *Attorney, Agent, or Firm* — Thompson Coburn LLP; Steven M. Richey

(57) ABSTRACT

A photovoltaic cell comprises a first layer of a first absorber material (1) comprising a front face, a rear face on which first contact electrodes having first polarity (101) are interdigitated with the second contact electrodes having second polarity (102), a second layer of a second absorber material (2), above the first layer, comprising a front face, of third (Continued)

contact electrodes having second polarity (203) being placed on the front face of the second layer, the first and second semiconductor materials having electron affinities and bandgap widths such that the carriers having the first polarity pass between the first and second layer and are collected from the first and second layers by the first electrodes (101), the carriers of second polarity are collected from the first layer by the second electrodes (102), and the carriers of second polarity are collected from the second layer by the third electrodes (203).

16 Claims, 6 Drawing Sheets

(51) Int. Cl.
*H01L 31/0687* (2012.01)
*H01L 31/0725* (2012.01)
*H01L 51/00* (2006.01)
*H01L 51/42* (2006.01)
*H01L 31/0693* (2012.01)

(52) U.S. Cl.
CPC ...... *H01L 31/0693* (2013.01); *H01L 31/0725* (2013.01); *H01L 51/0032* (2013.01); *H01L 51/4253* (2013.01); *H01L 51/4226* (2013.01); *Y02E 10/549* (2013.01)

(56) References Cited

U.S. PATENT DOCUMENTS

| | | | |
|---|---|---|---|
| 2010/0025663 A1* | 2/2010 | Sun | B82Y 10/00 |
| | | | 257/40 |
| 2010/0083997 A1* | 4/2010 | Hovel | B82Y 20/00 |
| | | | 136/244 |
| 2014/0209149 A1 | 7/2014 | Mascarenhas et al. | |
| 2015/0144196 A1* | 5/2015 | Irwin | H01G 9/2027 |
| | | | 136/261 |

* cited by examiner

PHOTOVOLTAIC CELL

CROSS-REFERENCE TO RELATED APPLICATIONS

This application is a U.S. National Phase application of PCT/FR2016/053195, filed on Dec. 2, 2016, which claims the benefit of FR Application No. 1561893, filed on Dec. 4, 2015, both of which are incorporated herein by reference in their entireties.

The present invention relates to photovoltaic cells.

More particularly, the invention relates to a p-n multi-junction photovoltaic cell.

There are two main types of multi-junction cells: two-electrode cells, one on the front face and the other on the rear face, and cells with three or four electrodes The first type uses a stack of several p-n junction sub-cells and is commonly referred to by the term monolithic.

The second type uses sub-cells operating independently of each other, wherein the contact electrodes specific to each of the sub-cells is formed on its upper and lower faces. In monolithic cells, only the first and last sub-cells are provided with electrodes, with the first one being on the front face and the last one being on the rear face. This requires careful adjustment of the thicknesses of the various constituent layers because the same current must flow through each of the sub-cells. Furthermore, it is essential in this type of structure to have tunnel junctions between the sub-cells in order to allow the passage of current from one sub-cell to the next.

The document "Towards highly efficient 4-terminal mechanical photovoltaic stacks" (G. Flamand et al., III-Vs review 19 (2006) 24) describes an example of a multi-junction photovoltaic cell with p-n junctions and separated by an insulating layer, wherein each p-n junction operates independently, and wherein the contact electrodes specific to each of the junctions is formed on its upper and lower faces. The production of such electrodes often requires complex etching processes in order to access the interface between the p-n junction and the insulating layer and so form the buried electrode between the p-n junction and the insulating layer on the lower face of the junction on top facing the upper face of the lower junction. In addition, the contact electrodes in the form of grids which ensure efficient collection of photo-generated carriers, must be perfectly aligned, in order to avoid increasing, in particular, shading by the metal parts of the grids on the lower junction.

The present invention is intended, in particular, to overcome these disadvantages.

In particular, p-n junctions with interdigitated contacts are already known, as described in the document "Design, manufacture and characterization of a 24.4% efficient inter-digitated back contact solar cell" by Franklin et al.

The invention proposes a p-n multi-junction photovoltaic cell architecture with a contact electrode common to the junctions.

To this end, according to the invention, a photovoltaic cell of the kind in question comprises at least a first layer of a first absorber material comprising a front face, and a rear face on which first contact electrodes have a first polarity and are interdigitated with second contact electrodes having a second polarity that is opposite to the first polarity, characterized in that the cell further comprises a second layer of a second absorber material and located above the front face of the first layer, and comprising a front face and a rear face, wherein third contact electrodes with the second polarity are placed on the front face of the second layer, while the first and second semiconductor materials have respective electronic affinities, on the one hand, and respective bandgap widths, on the other hand, which are chosen so that the carriers with the first polarity are able to transit via an interface between the first and the second layer and are collected from the set of first and second layers by the first electrodes, while the carriers with the second polarity are collected from the first layer by the second electrodes, and carriers with the second polarity are collected from the second layer by the third electrodes.

By virtue of these arrangements, the various contact electrodes of the photovoltaic cell are available without the need to etch and without the step of aligning buried contact grids. These photovoltaic cells, even at very high yields, are much less expensive to manufacture.

Optionally, in preferred embodiments of the invention, one or both of the following arrangements may be employed, wherein the carriers with the second polarity are collected from the second layer by the third electrodes, without the possibility of crossing the interface between the first and the second layer;

the first absorber material is doped corresponding to the first polarity;

the second layer comprises on its front face a contact layer carrying the third electrodes and being doped according to the second polarity;

it further comprises an intermediate layer between the first layer and the second layer, made of a third semiconductor material so that the intermediate layer blocks the second polarized photo-generated carriers in the second layer, so that they may only be collected by the third electrodes, and lets pass the carriers of first polarity photo-generated in the second layer so that they may be collected by the first electrodes;

the interface between the first and second layers comprises a mesh adaptation layer between the first and second materials;

at least one of the semiconductor materials is a stack of semiconductor alloys;

the first layer of absorber material is made of silicon (Si);

the second layer of absorber material comprises a gallium indium phosphide alloy (GaInP);

the intermediate layer comprises one among the following: gallium nitride (GaN), zinc oxide (ZnO), nickel oxide (NiO) or manganese oxide (MnO);

the second layer of absorber material is based on chalcopyrites (CIGS) stacked with cadmium sulphides (CdS) and/or sulphides and zinc oxides (ZnOS);

the second layer of absorber material (2) is in a material based on kesterites (CZTS) stacked with cadmium sulphides (CdS) and/or sulphides and zinc oxides (ZnOS);

the intermediate layer is a layer of zinc oxide (ZnO);

the second layer of absorber material is in a perovski-based material stacked on titanium dioxide ($TiO_2$) and in which the intermediate layer is fluorine doped tin dioxide (FTO);

the second layer of absorber material (2) is based on amorphous silicon or on hydrogenated microcrystalline silicon, or on an amorphous or microcrystalline silicon, carbon and oxygen alloy;

a surface is provided with an anti-reflection coating.

Other features and advantages of the invention will become apparent from the following description of one of its embodiments, given by way of a non-limiting example, with reference to the accompanying drawings, wherein:

FIG. 1 a, b, c show the structure, the energy band diagram, and the equivalent electrical diagram of a p-n multi-junction photovoltaic cell for which the first layer is n-doped;

FIG. 2 a, b, c show the structure, the energy band diagram, and the equivalent electrical diagram of a p-n multi-junction photovoltaic cell for which the first layer is p-doped.

FIG. 3 a, b show the case of a multi-junction photovoltaic cell with an intermediate layer;

FIG. 4 a, b show the case of a multi-junction photovoltaic cell when the second absorber material is a layer based on stacks of III-V alloys;

FIG. 5 a, b show the case of a multi-junction photovoltaic cell when an intrinsic gallium nitride layer serves as an intermediate layer 3;

In the various figures, the same references designate identical or similar elements.

In the context of the invention, polarity means the type n or the type p. The polarity of the electrode, carrier and doping is taken into consideration. The first polarity thus designates either the type n or the type p, while the second polarity designates the other type. N-type carriers are electrons and p-type carriers are holes.

Figure 1A:
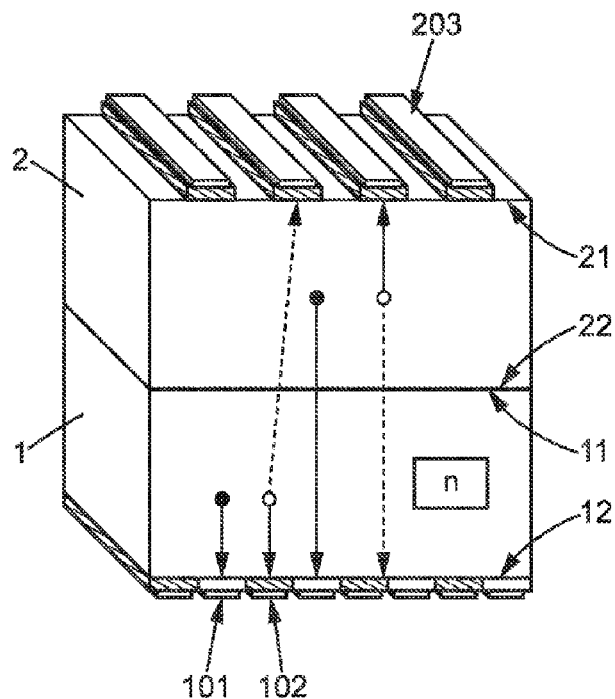

FIG. 1a shows a p-n multi-junction photovoltaic cell comprising:

a first layer of a first absorber material 1 of a first polarity comprising a front face 11, as well as a rear face 12 on which first contact electrodes 101 of the first polarity are interdigitated with second contact electrodes 102 having a second polarity, opposite to the first polarity, a second layer of a second absorber material 2 above the front face of the first layer 1, and comprising a front face 21 and a rear face 22, wherein third electrodes 203 having the second polarity are placed on the front face 21 of the second layer 2.

A first contact electrode 101 of first polarity is obtained by depositing a metal on highly doped material of first polarity. A second or third contact electrode of second polarity is obtained by depositing a metal on heavily doped material of second polarity.

Such architecture makes it possible to convert different parts of the solar spectrum, one part per absorber material, in order to obtain better yields.

FIG. 1a illustrates, in particular, the case where the first polarity is the n-type polarity, and the second polarity is the p-type polarity. In this case, the first contact electrodes 101 have an n-type polarity, while the second contact electrodes 102 have a p-type polarity, and the third contact electrodes 203 have a p-type polarity.

Figure 1B:
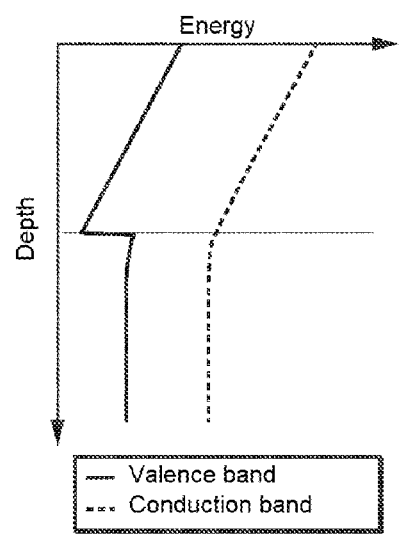

FIG. 1b shows the thermodynamic equilibrium energy band diagram of each layer in this case, i.e. the valence and conduction band thresholds in each layer and at the interface between the layers, depending on the thickness at which one looks at the cell. The first and second absorber materials, i.e. semiconductors, have respective electronic affinities, on the one hand, and respective bandgap widths (energy distance between the top of the valence band and the bottom of the conduction band) on the other hand, wherein they are so chosen:

that there is practically no discontinuity between the conduction bands between the first and the second absorber material, and that the forbidden bands of the two absorbers are chosen so that the tandem cell has the best efficiency.

The difference between the forbidden bands of the materials creates a discontinuity between the valence bands of the first and second absorbers so that at the interface between the first and second absorbers, the energy of the valence band of the first absorber material is, in particular, distinctly greater than the energy of the valence band of the second absorber material. So:

N-type carriers (electrons) are capable of passing from the second to the first layer via an interface and are collected from all the first and second layers by the first electrodes 101, and P-type carriers (holes) are collected from the first layer 1 by the second electrodes 102, P-type carriers (holes) are collected from the second layer 2 by the third electrodes 203.

Alternatively, when the discontinuity is very large, for example greater than 0.350 eV between the valence bands, the polarity carriers p are collected from the second layer 2 by the third electrodes 203, without the possibility of crossing the interface of the second layer towards the first layer.

Figure 1C:
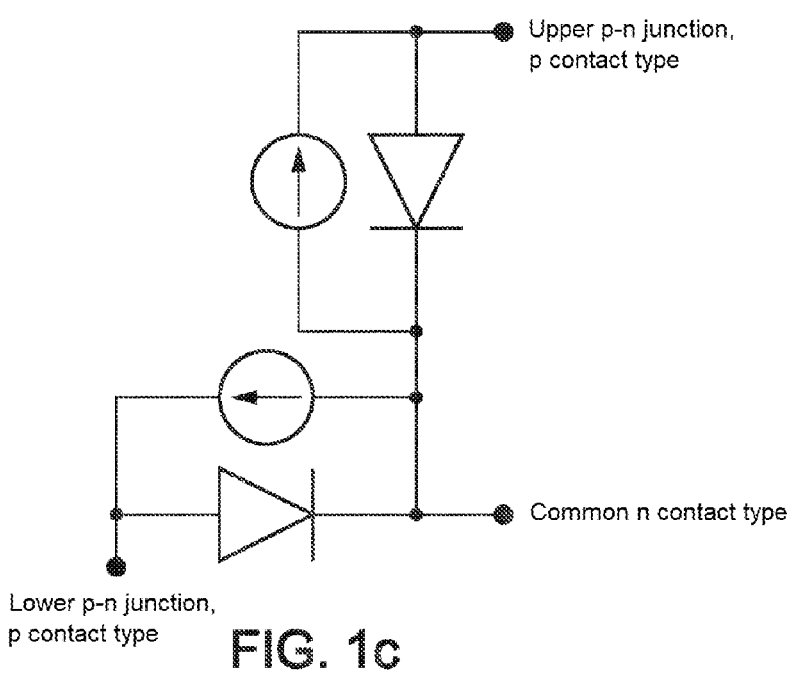

In a preferred embodiment, the first absorber material 1 is preferentially doped by type n. In particular, the first absorber material 1 may be silicon (Si). The second layer of absorber material 2 is, for example, a stack of p-doped or undoped semiconductor alloys. The second absorber 2 may be a stack of doped and undoped layers. Each p-n junction may be diagrammatically represented by a diode whose p side constitutes the anode and n side the cathode. The operation of the cell in the case of such a polarity may be schematized by the association of two diodes, wherein each diode is in parallel with a current generator, as shown in FIG. 1c.

Figure 2A:
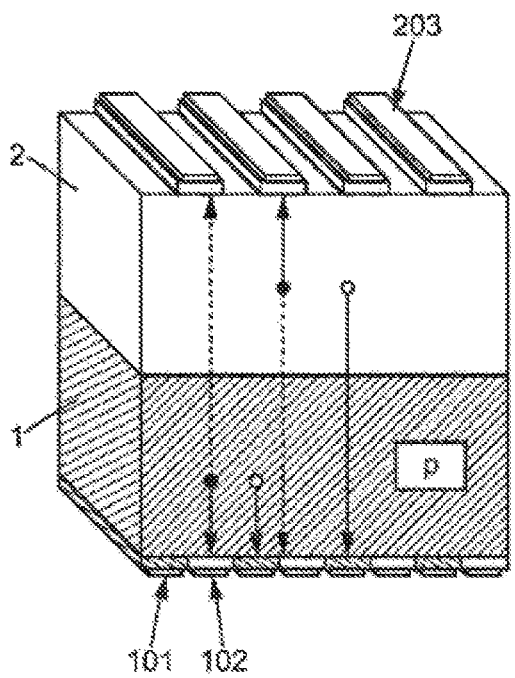
Figure 2B:
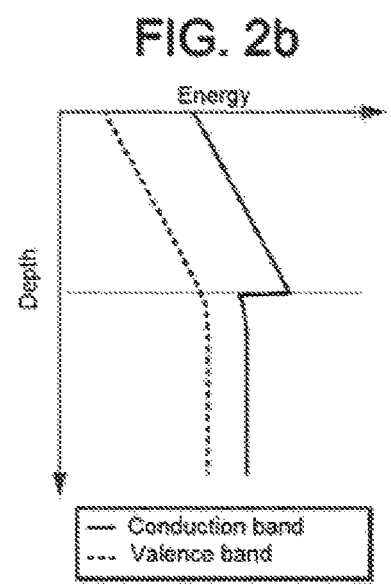

FIG. 2a illustrates the case of inverse polarity, i.e. the case where the first polarity is p-type polarity, and the second polarity is n-type polarity. In this case, the first contact electrodes 101 have a p-type polarity, the second contact electrodes 102 have an n-type polarity, and the third contact electrodes 203 have an n-type polarity. FIG. 2b shows the energy band diagram at the thermodynamic equilibrium of each layer in this case. The first and second absorber materials, i.e. semiconductors, have respective electronic affinities, on the one hand, and respective bandgap widths, on the other hand, that are so chosen:

that there is practically no discontinuity between the valence bands between the first and the second absorber materials, and that the forbidden bands of the two absorbers are chosen so that the tandem cell offers the best efficiency.

The difference between the forbidden bands of the materials creates a discontinuity between the conduction bands of the first and second absorbers so that, at the interface between the first and the second absorber, the energy of the conduction band of the first absorber material is notably distinctly lower than the energy of the conduction band of the second absorber material. So:

P-type carriers (holes) are capable of passing from the second to the first layer via the interface, and are collected from the set of first and second layers by the first electrodes 101, and N-type carriers (electrons) are collected from the first layer 1 by the second electrodes 102, N-type carriers (electrons) are collected from the second layer 2 by the third electrodes 203.

Alternatively, when the discontinuity is very large, for example greater than 0.350 eV between the conduction bands, the carriers of polarity n are collected from the second layer 2 by the third electrodes 203, without the possibility of crossing the interface of the second towards the first layer. In a preferred embodiment, the first absorber material 1 is preferably doped type p. In particular, the first absorber material 1 may be silicon (Si). The second absorber 2 is a stack of n-doped or undoped semiconductor alloys. The second absorber 2 may be a stack of doped and undoped layers.

Figure 2C:
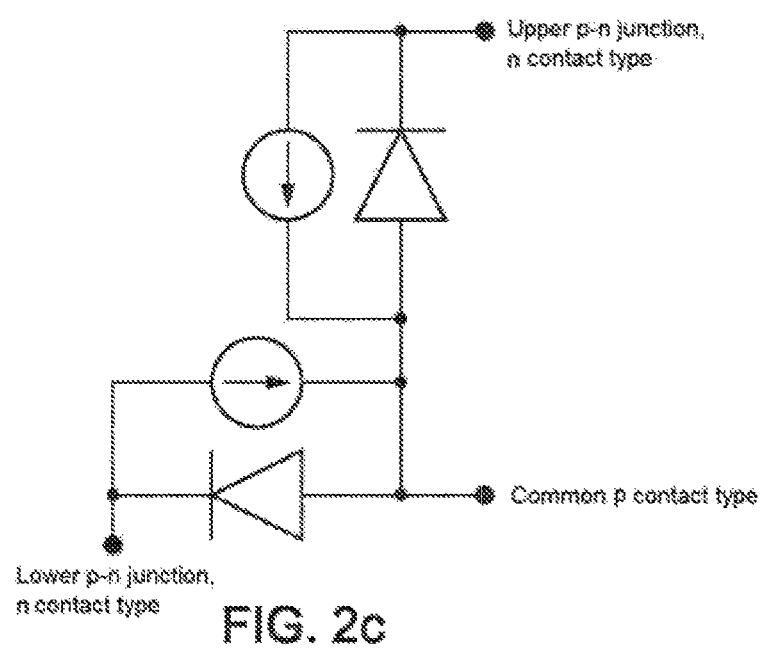

The operation of the cell in the case of such a polarity may also be schematized by the association of two diodes, wherein each diode is in parallel with a current generator, as shown in FIG. 2c.

In the particular case where the first layer of absorber material 1 has a forbidden bandwidth of 1.12 eV, for example in the case of silicon, the second layer of absorber material 2 is, for example, semiconducting with preferably a forbidden bandwidth between 1.7 and 1.8 eV.

Figure 3A:
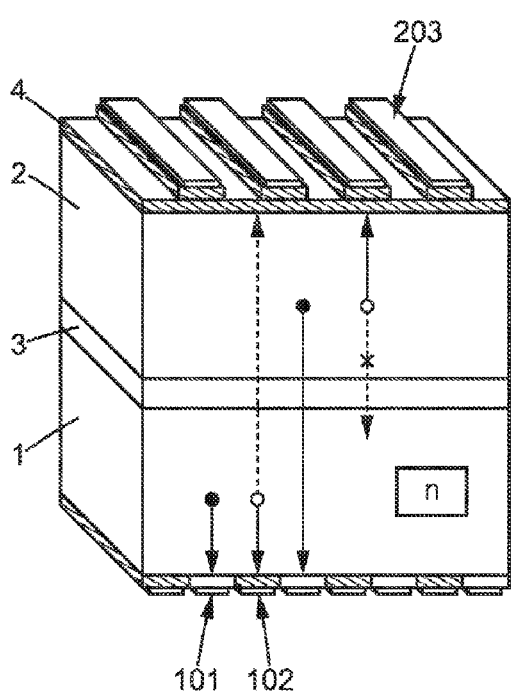

As illustrated in FIG. 3a, the second layer 2 may comprise, in its front face, a contact window layer (wide band forbidden) 4 carrying the third electrodes 203 and being doped according to the polarity p in the case where the first polarity is the polarity of type n and the second polarity is the polarity of type p. The contact window layer 4 is, for example, in a stack of p-doped semiconductor alloys.

Figure 3B:
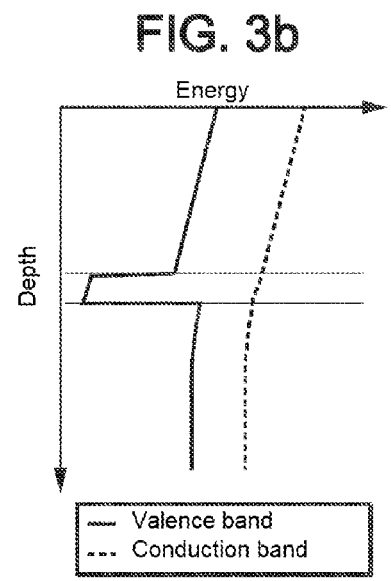

FIG. 3a also illustrates the case where the photovoltaic cell further comprises an intermediate layer 3 between the first layer 1 and the second layer 2 and that is made of a third semiconductor material in the case where the first polarity is of n-type polarity and the second polarity is of p-type polarity. As illustrated energetically in FIG. 3b, the intermediate layer 3 creates an energy distance between the highs of the valence bands of the two layers of absorber material thus selecting the possible carrier flows. Thus, the intermediate layer 3 blocks the photo-generated polarity carriers p in the second layer 2 to be collected solely by the third electrodes 203, and passes the photo-generated polarity carriers n in the second layer 2 to be collected by the first electrodes 101. The intermediate layer 3 is, for example, a semiconductor or a stack of semiconductor alloys.

The interface between the first and second layers 20 may comprise a mesh adaptation layer 40 between the first and second materials.

The semiconductor stacks may be obtained either by direct growth on the upper face of the layer on which they are deposited, or by growth on a suitable substrate, followed by chemical or laser etching and bonding on the upper face of the layer.

Figure 4A:
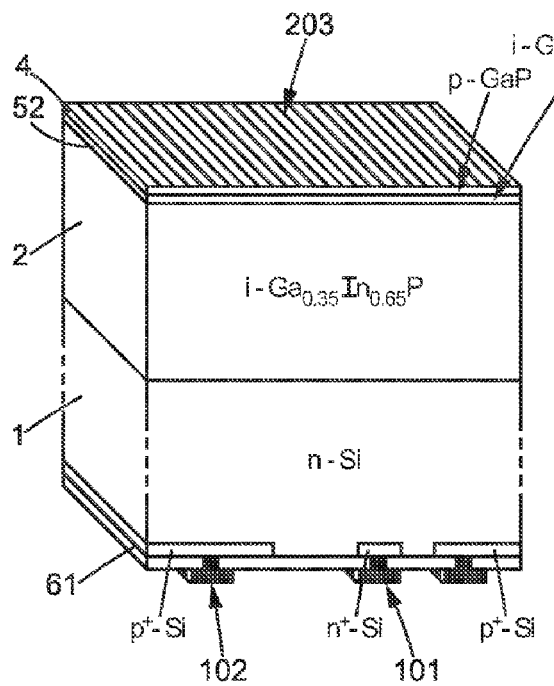

In a first exemplary embodiment of the invention as illustrated in FIG. 4a, the first absorber material is n-doped silicon, and the second absorber material is a layer based on III-V alloy stacks, for example a gallium indium phosphide alloy GaInP. The first absorber material has, for example, a thickness of 250 μm and a doping density of $2*10^{15}$ cm$^{-3}$. The second absorber material is, for example, intrinsic $Ga_{0.35}In_{0.65}P$. The layer of $Ga_{0.35}In_{0.65}P$ may, for example, have a thickness of 1 μm and a doping density of $10^{14}$ cm$^{-3}$.

Figure 4B:
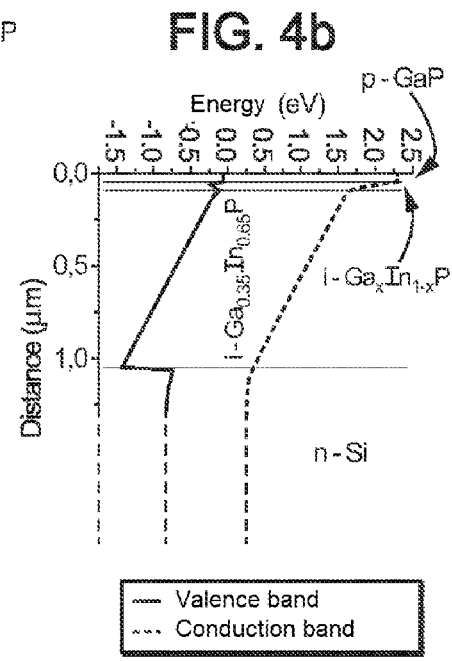

Optionally, the $Ga_{0.35}In_{0.65}P$ layer may be covered with an adaptation layer 52 of $Ga_xIn_{1-x}P$ with a thickness of 50 nm and a doping density of $10^{14}$ cm$^{-3}$. The $Ga_xIn_{1-x}P$ layer may, for example, be a graded bandgap layer. The advantage of such a layer is that it ensures continuity of the bands as illustrated in FIG. 4b which gives the energy of the valence and conduction bands of the cell as a function of the depth. In the case where a contact window layer 4 is carried by the front face of the second layer, it may be a p-doped Gallium GaP phosphide layer, for example with a thickness of 20 nm and a doping density of $2*10^{18}$ cm$^{-3}$. For example, the first contact electrodes 101 have a width of 25 μm over the entire depth of the material and are, for example, separated from the second contact electrodes 102 by 50 μm. They are, for example, formed by a local doping of silicon. The second contact electrodes 102 each have, for example, a width of 75 μm over the entire depth of the material and a thickness of 150 nm. An anti-reflective coating may be deposited on the surface of the cell to increase its efficiency. A reflective layer 61 may, for example, be placed between the first and second electrodes, and the silicon locally doped (n+ and p+).

As illustrated in FIG. 4b, the respective electronic affinities, on the one hand, and the respective bandgap widths, on the other hand, are such that there is practically no discontinuity between the conduction bands of the first and second absorber materials, and that there is a discontinuity between the valence bands such that at the interface between the first and the second absorbers, the energy of the valence band of the first absorber material is distinctly greater than the energy of the valence band of the second absorber material.

Thus n-type carriers are able to pass from the second to the first layer via the interface, and are collected from the set of first and second layers by the first electrodes 101, while p-type carriers are collected from the first layer 1 by the first electrodes 101, and p-type carriers are collected from the second layer 2 by the third electrodes 203, and from the first layer 1 by the second electrodes 102.

Figure 5A:
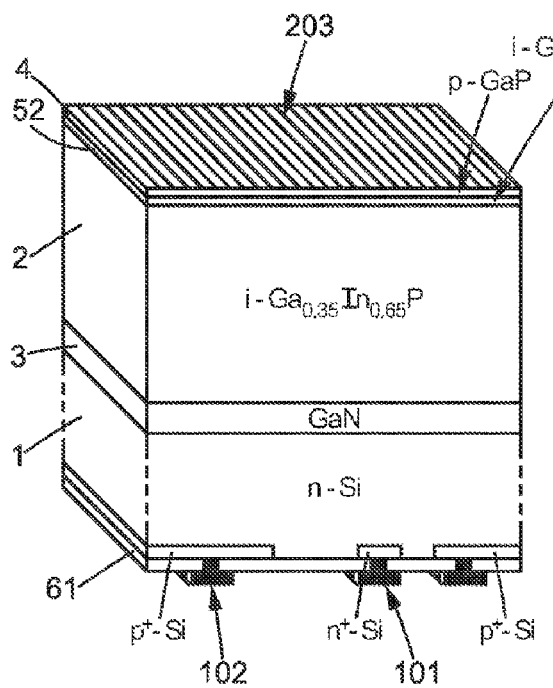
Figure 5B:
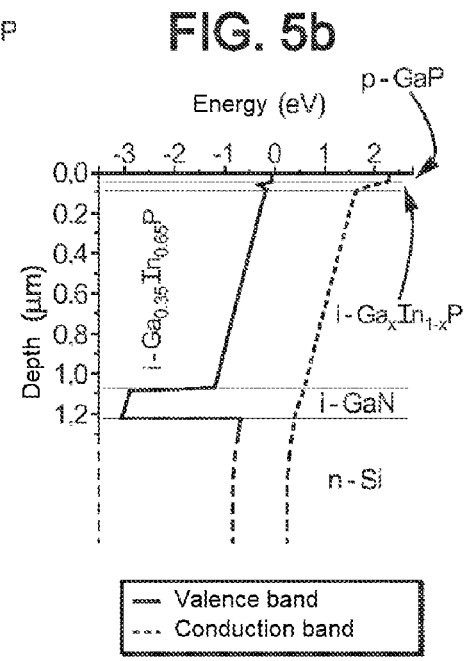

FIG. 5a illustrates the case of the same photovoltaic cell as that illustrated in FIG. 4 but in a case where an intrinsic gallium nitride GaN layer serves as an intermediate layer 3 between the first layer of absorber material 1 and the second layer of absorber material 2. In this case, as illustrated by the thermodynamic equilibrium energy band diagram of FIG. 5b, the gallium nitride GaN layer has a conduction band discontinuity that is almost zero with silicon Si but a valence band discontinuity of about 2.3 eV with this. For example, the gallium nitride GaN layer has a thickness of 150 nm. N-type carriers are able to pass from the second to the first layer via an interface, and are collected from all the first and second layers by the first electrodes 101, wherein p-type carriers are collected from the first layer 1 by the second electrodes 102, and wherein p-type carriers are collected from the second layer 2 by the third electrodes 203, without the possibility of crossing the interface between the first and the second layer. In particular, the intermediate layer 3 blocks the photo-generated p polarity carriers in the second layer 2 so that they are collected solely by the third electrodes 203, without the possibility of being collected by the second electrodes 102.

Figure 6:
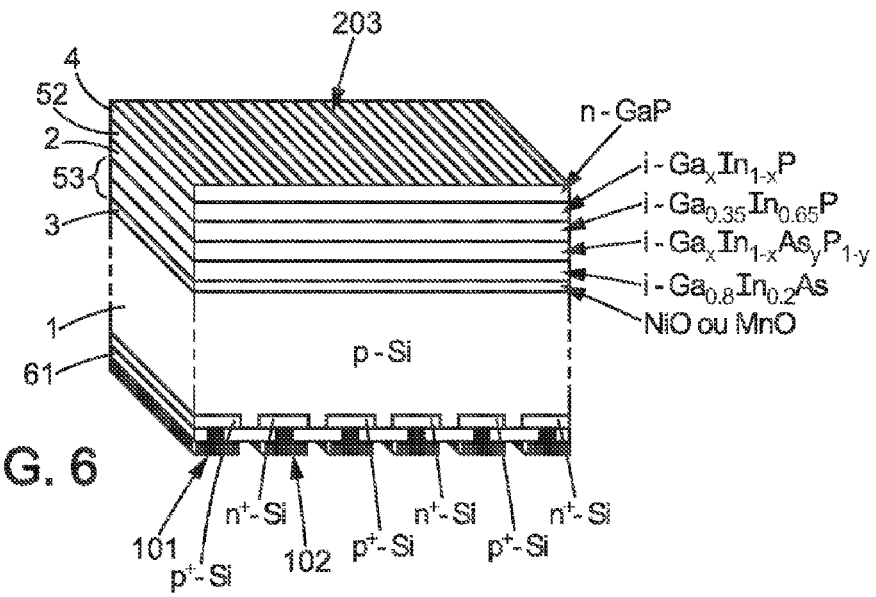
FIG. 6 shows the case of a multi-junction photovoltaic cell when the second layer of absorber material is a layer of gallium and indium phosphide alloy.

In a second exemplary embodiment, illustrated in FIG. 6, the first layer of absorber material is a p-doped silicon layer, while the second layer of absorber material is a layer of gallium and indium phosphide alloy $Ga_{0.35}In_{0.65}P$ (or a stack of such layers). A stack of layers of gallium and indium arsenide $Ga_{0.8}In_{0.2}As$ and intrinsic gallium and indium phosphide and arsenide $Ga_xIn_{1-x}As_yP_{1-y}$ form an adaptation layer 53 on the rear face. An intrinsic gallium indium phosphide alloy $Ga_xIn_{1-x}P$ layer forms another adaptation layer 52. The intermediate layer 3 is a layer of nickel oxide NiO or manganese oxide MnO. The contact window layer 4 is an n-doped gallium phosphide GaP layer.

Figure 7:
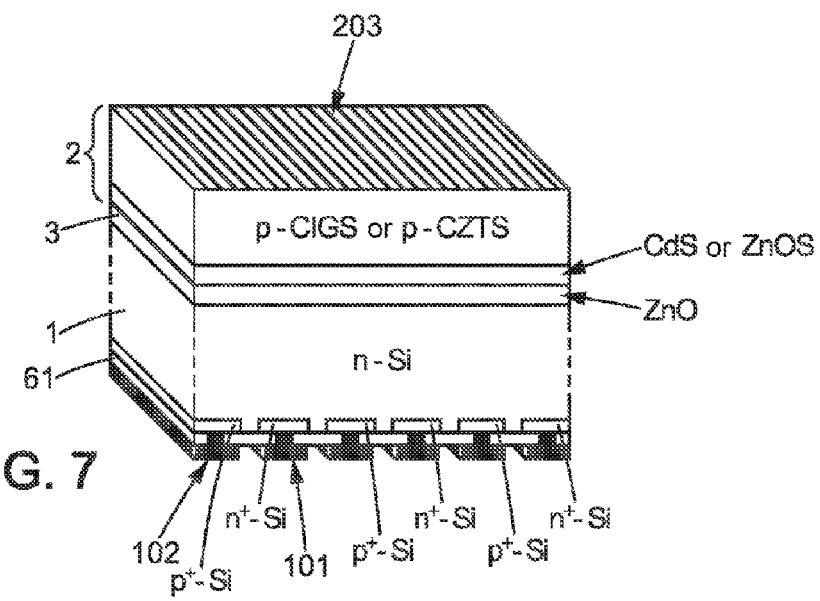
FIG. 7 shows the case of a multi-junction photovoltaic cell when the second layer of absorber material is a stack of a layer of cadmium sulphide or of sulphide and zinc oxide with a layer of material based on chalcopyrites or kesterites.

In a third exemplary embodiment, illustrated in FIG. 7, the first layer of absorber material is an n-doped silicon layer, while the second layer of absorber material is a stack of a layer of cadmium sulphide CdS or a zinc oxide and sulphide ZnOS layer with a chalcopyrite-based material layer $Cu(In, Ga) (Se, S)_2$ (CIGS) or kesterites material $CU_2ZnSn (Se, S)_4$ (CZTS), that is, for example, p-doped. The intermediate layer 3 is a layer of zinc oxide (ZnO), for example 200 nm thick, and with an electronic affinity and a bandgap adapted to the two absorbers. The photovoltaic performances are then almost the same.

Figure 8:
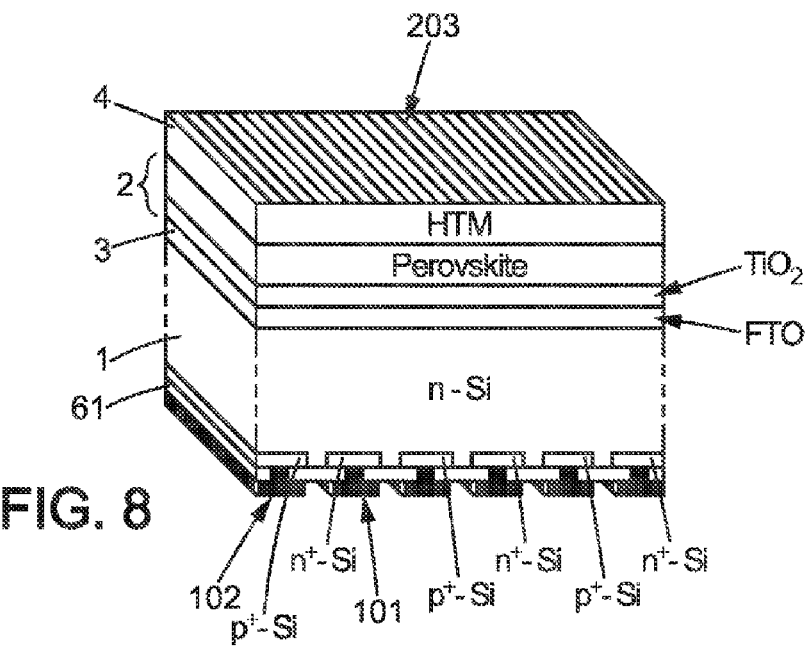
FIG. 8 shows the case of a multi-junction photovoltaic cell when the second layer of absorber material 2 is based on perovskites stacked on titanium dioxide.

In a fourth exemplary embodiment, illustrated in FIG. 8, the first layer of absorber material is an n-doped silicon layer while the second layer of absorber material 2 is based on perovskites stacked on titanium dioxide $TiO_2$. The intermediate layer 3 is made of a fluorine-doped tin dioxide material FTO. The contact window layer 4 is a layer of material transporting holes (HTM).

Alternatively, at least one of the semiconductor layers may be amorphous or microcrystalline in a thin layer. In particular, it may be amorphous semiconductors in thin layers, based on hydrogenated amorphous silicon or hydrogenated amorphous alloys selected from silicon, carbon, and/or oxygen. The use of such semiconductors allows an implementation facilitated by PECVD type "low temperature" deposition processes (typically <250° C.), and therefore low cost (compared to high temperature methods).

One of the advantages of the use of these materials is the possibility of producing semiconductors with a difference in energy between the valence band and the conduction band which is clearly greater than the difference obtained for crystalline silicon, hence the interest of such a material for the upper junction in particular.

A suitable deposit of amorphous or microcrystalline layers may be made directly at low temperature on crystalline silicon. In fact, it is recognized that hydrogenated amorphous silicon makes it possible to obtain excellent passivation of the crystalline silicon surface while the low temperature deposition process makes it possible to avoid degrading the electronic properties of crystalline silicon, unlike epitaxy at high temperature.

It may, for example, be a structure with an upper junction of hydrogenated amorphous silicon or an amorphous alloy of hydrogenated silicon carbide or hydrogenated amorphous silicon oxide, deposited on the surface of a crystalline silicon junction with contacts at the back.

Figure 9:
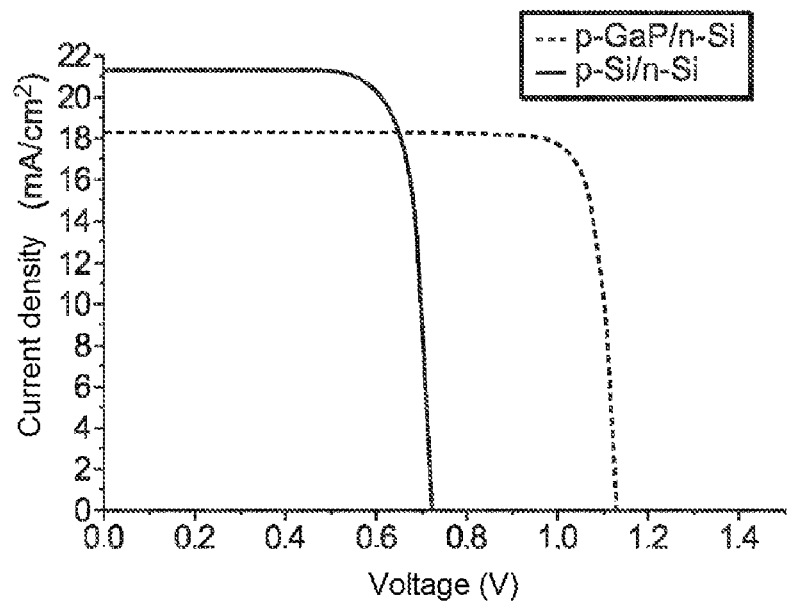
FIG. 9 shows the current density extracted at the electrodes as a function of the voltage generated across the electrodes.

FIG. 9 illustrates:
the current density extracted from the electrode 203 as a function of the voltage generated across the electrodes 203 and 101, (p-GaP/n-Si curve),
the current density extracted from the electrode 102 as a function of the voltage generated across the electrodes 102 and 101, (p-Si/n-Si curve),
in the case of a photovoltaic cell as described in the application whose surface has been covered with an anti-reflection coating layer (p-GaP/n-Si curve), and in the case of a conventional silicon photovoltaic cell (p-Si/n-Si). The anti-reflection layer is for example a polymethyl methacrylate PPMA layer.

The yield obtained is, for example, of the order of 27.20% in the absence of an intermediate layer 3 and of the order of 31.68% in the case of an intermediate layer 3.

The invention claimed is:

1. A p-n multi junction photovoltaic cell with a common contact electrode comprising at least a first layer of a first absorber material comprising a front face and a rear face on which first contact electrodes have a first polarity and are interdigitated with second contact electrodes having a second polarity, opposite to the first polarity,
wherein the cell further comprises:
a second layer of a second absorber material, above the front face of the first layer, and comprising a front face and a rear face, wherein third contact electrodes having the second polarity, are placed on the front face of the second layer; and
the first and second semiconductor materials, have respective electronic affinities, on the one hand, and respective bandgap widths, on the other hand, chosen so that:
carriers with the first polarity are able to transit between the first and the second layer via an interface, and are collected from the set of first and second layers by the first electrodes;
carriers with the second polarity are collected from the first layer by the second electrodes; and
carriers with the second polarity are collected from the second layer by the third electrodes.

2. The photovoltaic cell according to claim 1, wherein carriers having the second polarity are collected from the second layer by the third electrodes, without the possibility of crossing the interface between the first and the second layers.

3. The photovoltaic cell according to claim 1, wherein the first absorber material is doped according to the first polarity.

4. The photovoltaic cell according to claim 1, wherein the second layer comprises in its front face a contact layer carrying the third electrode and being doped according to the second polarity.

5. The photovoltaic cell according to claim 1, wherein it further comprises an intermediate layer between the first layer and the second layer, made of a third semiconductor material so that the intermediate layer blocks the second polarity carriers photo-generated in the second layer in order to be collected only by the third electrodes; and
lets pass the carriers of first polarity photo-generated in the second layer in order to be collected by the first electrodes.

6. The photovoltaic cell according to claim 1, wherein the interface between the first and second layers has a mesh adaptation layer between the first and second materials.

7. The photovoltaic cell according to claim 1, wherein at least one of the semiconductor materials is a stack of semiconductor alloys.

8. The photovoltaic cell according to claim 1, wherein the first layer of absorber material is in silicon (Si).

9. The photovoltaic cell according to claim 1, wherein the second layer of absorber material comprises a gallium indium phosphide alloy (GaInP).

10. The photovoltaic cell according to claim 9 wherein the intermediate layer comprises one alloy among gallium nitride (GaN), zinc oxide (ZnO), nickel oxide (NiO) or manganese oxide (MnO).

11. The photovoltaic cell according to claim 1, wherein the second layer of absorber material is based on chalcopyrites (CIGS) stacked with cadmium sulphides (CdS) and/or zinc oxides and sulphides (ZnOS).

12. The photovoltaic cell according to claim 1, wherein the second layer of absorber material is in a kesterite material (CZTS) stacked with cadmium sulphides (CdS) and/or zinc oxides and sulphides (ZnOS).

13. The photovoltaic cell according to claim 11, wherein the intermediate layer is a layer of zinc oxide (ZnO).

14. The photovoltaic cell according to claim 1, wherein the second layer of absorber material is in a material based on perovskites stacked on titanium dioxide ($TiO_2$) and wherein the intermediate layer is fluorine-doped tin dioxide (FTO).

15. The photovoltaic cell according to claim 1, wherein the second layer of absorber material is based on amorphous silicon or hydrogenated microcrystalline silicon, or an amorphous or microcrystalline silicon, carbon and oxygen.

16. The photovoltaic cell according to claim 1, wherein a surface is provided with an anti-reflective coating.

* * * * *